United States Patent
Severn

[11] Patent Number: 5,991,059
[45] Date of Patent: Nov. 23, 1999

[54] MARSHALLING IN OPTICAL TDMA SYSTEMS

[75] Inventor: John Kenneth Severn, Devon, United Kingdom

[73] Assignee: Northern Telecom Limited, Montreal, Canada

[21] Appl. No.: 08/844,129

[22] Filed: Apr. 18, 1997

[30] Foreign Application Priority Data

Apr. 20, 1996 [GB] United Kingdom ............... 9608234

[51] Int. Cl.⁶ .................. H04B 10/14; H04B 10/24; H04J 14/08

[52] U.S. Cl. .................. 359/152; 359/153; 359/138; 359/159

[58] Field of Search ............... 359/152, 153, 359/161, 138, 159

[56] References Cited

U.S. PATENT DOCUMENTS 5,528,596  6/1996  Fisher et al. ............... 370/95.3

FOREIGN PATENT DOCUMENTS

| 0 116 304 A2 | 1/1984 | European Pat. Off. . |
| 0 634 742 A1 | 6/1994 | European Pat. Off. . |
| 2 225 422A | 8/1988 | United Kingdom . |
| 2 224 611A | 11/1988 | United Kingdom . |
| 2 226 127A | 12/1990 | United Kingdom . |

*Primary Examiner*—Leslie Pascal
*Attorney, Agent, or Firm*—Lee, Mann, Smith, McWilliams, Sweeney & Ohlson

[57] ABSTRACT

A TDMA basestation transmitter has a monolithic concentric arrangement of two monitor photodiodes (14a, 14b) for use in power output regulation both in marshalling procedure and in normal data traffic situations where there are two distinct speed and sensitivity requirements to be satisfied at different times.

2 Claims, 4 Drawing Sheets

MARSHALLING IN OPTICAL TDMA SYSTEMS

BACKGROUND TO THE INVENTION

This invention relates to marshalling procedures in optical TDMA (time division multiple access) systems. In such a system a plurality of outstations communicate with a basestation on a TDMA basis while the basestation may communicate with its outstations on a broadcast basis. In such a system there is a fundamental requirement that the system should be able to measure, and then equalise, the propagation delays on each spur linking an outstation with the basestation. This measurement can be made by transmitting signals at normal power from each of the outstations to the basestation, and noting the time of receipt of those signals. However, in a practical system the uncertainty in this time occasioned by the different propagation delays means that a substantial period of potential transmission time in the upstream (outstation to basestation) direction needs to be reserved for the receipt of these signals. This method is referred to as "serial marshalling" since it can not be carried out simultaneously with the upstream transmission of data traffic.

An alternative marshalling method, the method with which the present invention is particularly concerned, involves an initial marshalling procedure which involves the use of transmissions at power levels too low to have significant affect upon normal data traffic, so that these initial marshalling transmissions can therefore be transmitted in parallel with that data traffic. This involves the outstation transmitting a pseudo-random bit sequence which is detected at the basestation by cross-correlation. Such an initial marshalling method is for instance described in U.S. Pat. No. 5,528,596.

The optical source of an outstation is provided by a directly modulated semiconductor laser chip and, because the electro-optic conversion efficiency of such a device varies with temperature and with the effects of ageing, it is conventional practice to regulate its optical power output with the aid of a feedback control loop, deriving a feedback control signal from the photocurrent produced by a monitor photodetector positioned to intercept a part of the laser's emission. Typically this photodetector is positioned to intercept light emitted from the back facet of the laser.

For some general applications of digitally data modulated semiconductor laser sources it is sufficient for its feedback loop to respond to the mean level of optical power output of the laser, and for there to be, in consequence, no need for the photodetector's response to be fast enough to resolve individual data bits. On the other hand, in TDMA applications a response fast enough to resolve these bits is typically a desideratum, the meeting of which places an upper limit upon the size of the photosensitive area of the photodetector due to capacitance effects.

When initial marshalling commences, the output power of the outstation's laser chip must, under the least favourable conditions, be low enough to avoid producing unacceptably high corruption of data being simultaneously transmitted to the basestation from any other outstation. Typically this transmission will be at a power level too low for the cross-correlation performed at the basestation to detect it. The power level of the transmission must then be incremented in steps until it is large enough to be detected. The size of those steps is regulated on the one hand by the need to make them small enough for a single increment not to raise the power level from undetectable to data-corrupting, and on the other hand to make them large enough to ensure that detection will occur within a reasonably short time interval from the commencement of the initial marshalling.

Implicit in the foregoing is the fact that regulation of the optical power output of the outstation's laser chip is required, not only during data transmission, but also during the initial marshalling process, and that at least in the initial stages of the initial marshalling process, the optical output power of the laser chip needs to be regulated to a power level very much lower than that employed during data transmission, typically commencing at a power level in the region of 40 dB below that of the data bits. This commencement power level is liable to be so low as to provide an inadequate photocurrent from a back-facet monitor diode that is small enough to have a response fast enough to resolve individual data bits during data traffic transmission.

One way of circumventing the problem of having too low a light level, during at least the initial stages of initial marshalling for detection by a monitor photodiode fast enough to resolve individual data bits, is to create a look-up table that relates power output to drive current from calibration measurements made on a test jig before the laser is ever brought into service. (Such a test jig would derive its calibration from measurements made with its own photodetector rather than the monitor photodiode of the laser itself). Under these circumstances, due allowance can be made for the effects of temperature, but importantly not for those of ageing.

The absence of a means for making allowance for the effects of ageing gives rise to a magnitude of uncertainty in optical power level output for which due allowance must be made in the devising of the incremental power steps in a manner that avoids the risk of data corruption, and this in turn has the effect of lengthening the time taken to complete initial marshalling.

SUMMARY OF THE INVENTION

The present invention is directed to regulation of the optical power output of an optical outstation by means of a feedback control loop that is operative not only during data traffic transmission, when it operates fast enough to resolve individual data bits, but also during initial marshalling, when the power level is too low for satisfactory operation of a feedback control loop deriving its control signal from a photodetector fast enough to resolve individual data bits.

According to the present invention there is provided in an optical communications system, a marshalling method to control timing of communication signals between a plurality of outstations and a basestation, said method comprising transmitting a marshalling signal from an optical source at a first outstation to the basestation at a low signal strength and deriving a feedback control signal selectively from monitor first and second photosensor parts at said outstation to control said source during said communication signal transmission and during said marshalling procedure such as to provide separate feedback control of the level of the communication and marshalling signals.

The invention also provides in an optical time division multiple access system having optical communication between a basestation and a plurality of outstations, a method of regulating the optical power output of an optical outstation during the transmission of data traffic from the outstation to the basestation and during a marshalling procedure that involves the transmission of a signal from the outstation to be received at the basestation at a signal strength too low to create significant corruption of data traffic received by the basestation from other outstations, which optical power output is the optical output of a current modulated injection laser chip whose current drive is regulated by a feedback control loop deriving a feedback control signal from the output of a monitor photosensor formed with a small area inner photosensitive part embraced or encircled by a larger area slower response outer part, in which method of regulation, the feedback control signal is derived solely from the inner part during said data traffic transmission, and is derived at least in part by the outer part during said marshalling procedure.

The invention also provides an optical time division multiple access outstation including a feedback control means for regulating the optical power output of a laser diode provided with a composite monitor photodiode having a small area photosensitive part embraced or encircled by a larger area slower response outer part, which feedback control means, by the operation of a gate, is adapted to derive a feedback control signal from both parts of the monitor photodiode when regulating the power beneath a predetermined power threshold level, and to derive a feedback control signal solely from the small inner part when regulating for power above said predetermined threshold level.

BRIEF DESCRIPTION OF THE DRAWINGS

There follows a description of an outstation optical power output controller for a TDMA system embodying the invention in a preferred form. The description refers to the accompanying drawings in which.

DETAILED DESCRIPTION OF PREFERRED EMBODIMENTS

Figure 1:
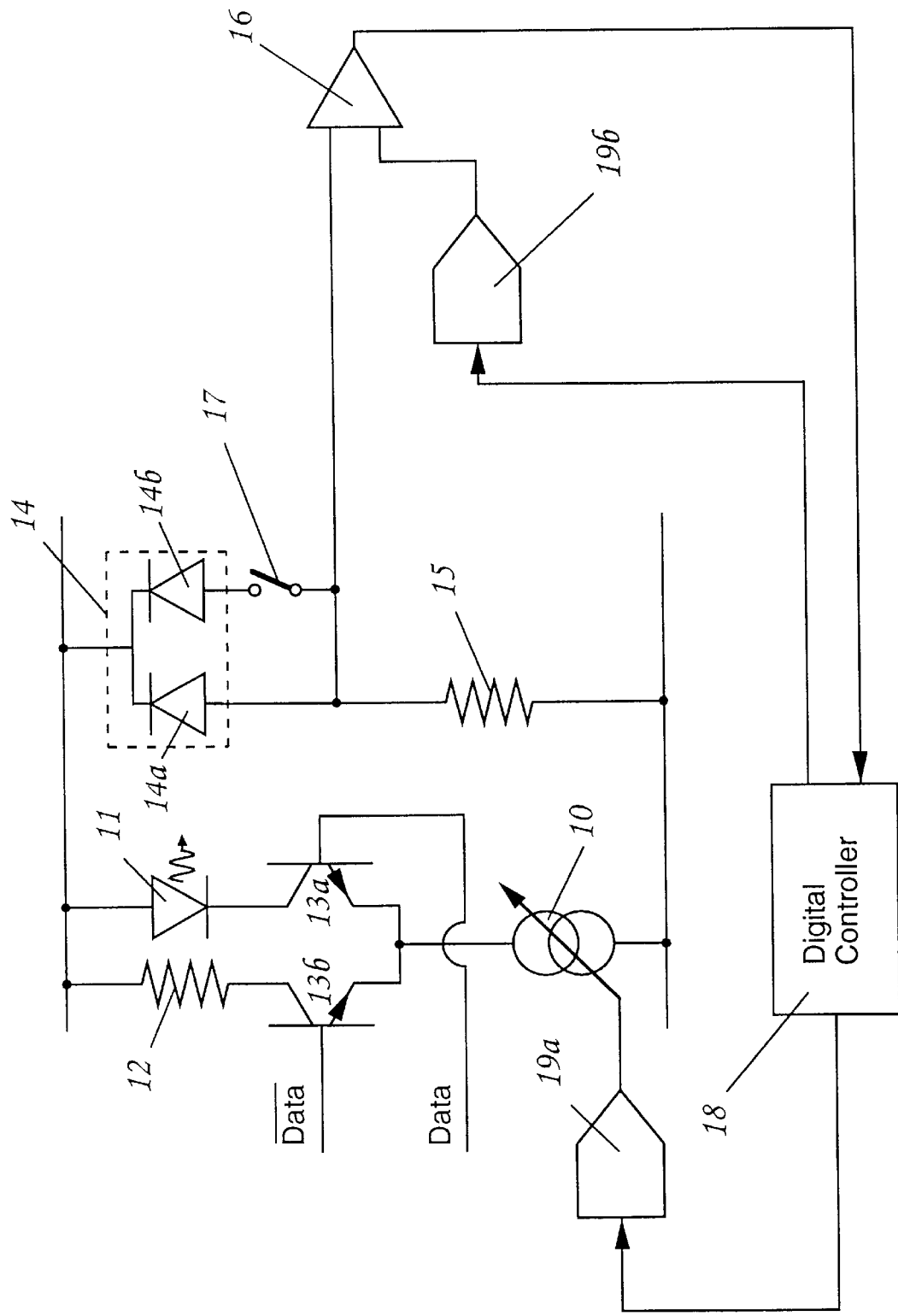
FIG. 1 is a circuit diagram of the outstation optical power output controller.

Referring to FIG. 1, drive current from a current source 10 is switched between a laser diode 11 and a dummy load 12 by means of a long-tailed transistor pair 13a, 13b supplied respectively with a data signal and its inverse. Light emitted from the front facet of the laser diode 11 is directed to the TDMA system base station (not shown), while that emitted from the rear facet is directed to a monolithic composite back-facet monitor photodiode 14 having a fast small area photodiode 14a embraced or encircled by a larger area, and hence slower, photodiode 14b.

Figure 2A:
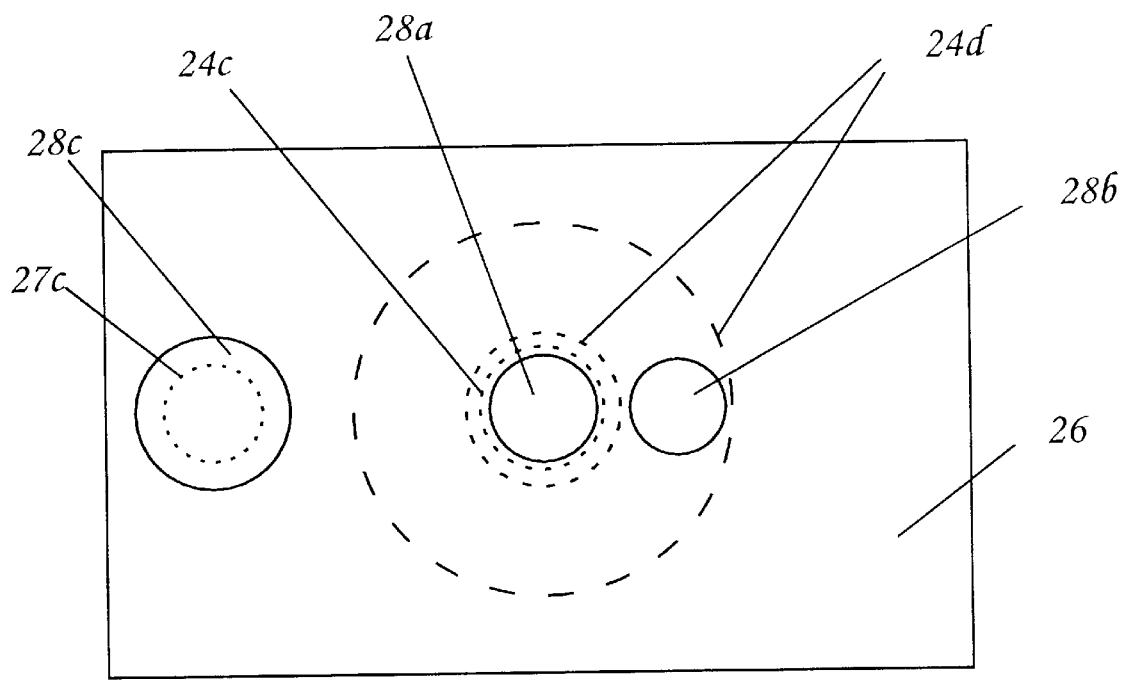
FIGS. 2A and 2B respectively depict plane and longitudinal mid-plane sectional schematic views of a rear light-entry photodiode of the controller of FIG. 1, FIGS. 3A and 3B respectively depict equivalent views of a front light-entry alternative to the photodiode of FIGS. 2A and 2B.
Figure 2B:
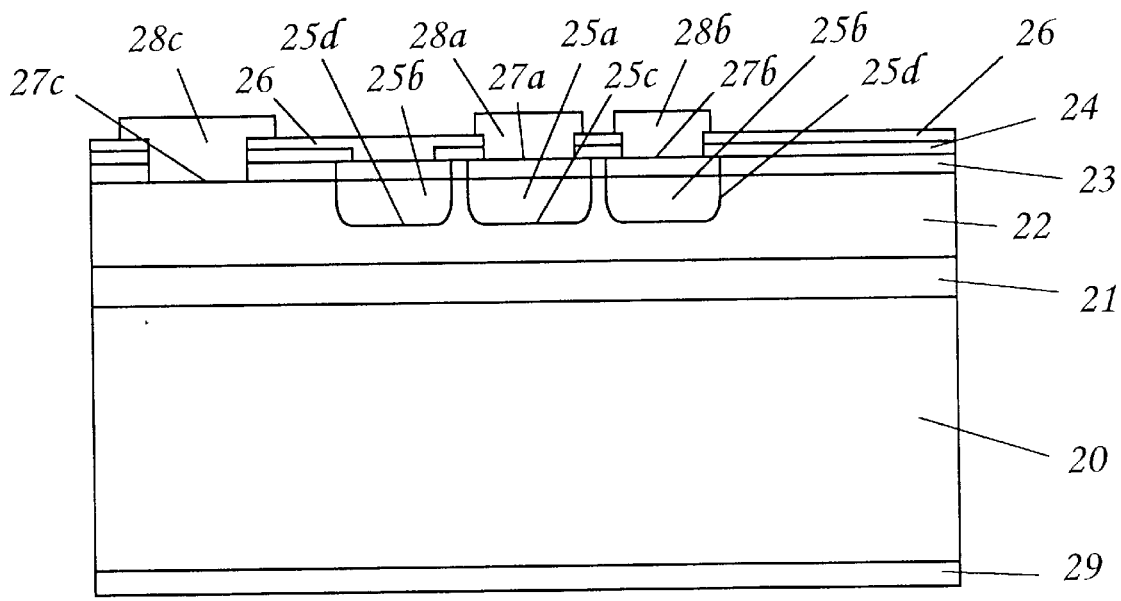

In the case of the rear light-entry version of the dual-area photodiode of FIGS. 2A and 2B, the structure comprises a substrate 20 of InP on which is grown an InP buffer layer 21, an InGaAs absorption layer 22, and an InP capping layer 23, all this material being of n-type. A p-type diffusion is performed through a diffusion mask 24 to convert a central small area inner region 25a and a concentrically surrounding annular larger area outer region 25b into p-type material. The respective diffusion fronts are indicated by lines 25c and 25d. The diffusion mask 24 and the exposed regions of the capping layer 23 are then covered with a dielectric layer 26.

In a region outside the confines of the p-type diffusion, a window 27c is etched through this dielectric layer, through the mask layer, and through the capping layer 23 to the absorption layer 22. Additionally, windows 27a and 27b are etched through the dielectric layer to the capping layer respectively in the central and annular p-type diffusion regions 24a and 24b. Next a layer of contact metal is deposited and patterned to provide contacts 28a, 28b and 28c in the windows 27a, 27b and 27c, to form respectively the p-side contact of the small area photodiode 14a (FIG. 1), the p-side contact of the larger area photodiode 14b, and their common n-side contact. An anti-reflection coating 29 is applied to the bottom surface of the substrate.

Figure 3A:
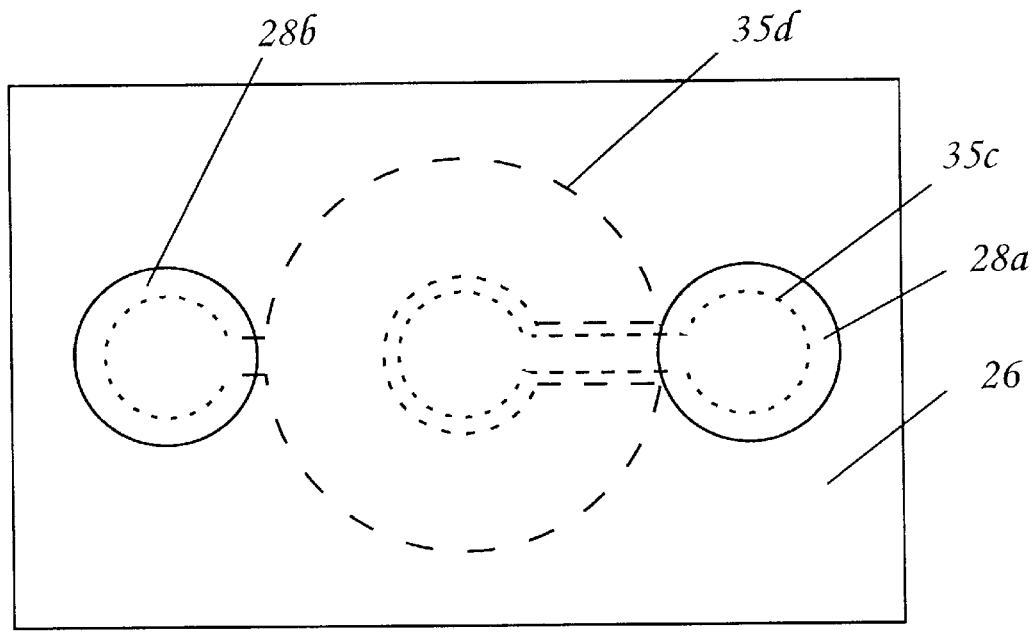
Figure 3B:
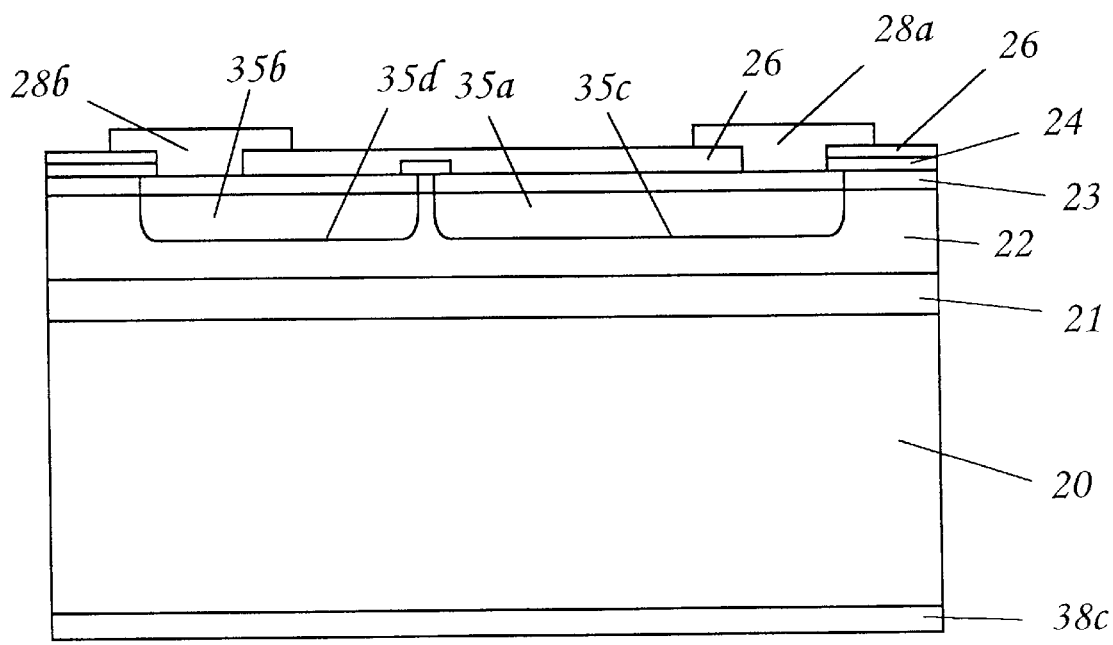

The front light-entry version of the dual-area photodiode of FIGS. 3A and 3B has the same basic structure as that of the photodiode of FIGS. 2A and 2B. Thus it has the same semiconductor layer structure. However, in this instance the configuration of the p-type diffusion is changed in order to allow the p-type contacts 28a and 28b to be moved to positions where they will not obstruct the incident light. Accordingly the configuration of the small 'inner' p-type region 35a is basically that of a dumb-bell, its diffusion front being indicated by line 35c. One end of the dumb-bell provides the contact area, the other end provides the photosensitive area, and the connecting bar provides the p-type electrical interconnection between the two ends. The configuration of the larger area 'outer' p-type region 35b is basically C-shaped, its diffusion front being indicated by line 35d, with a C-shaped photosensitive area embracing the photosensitive area end of the dumb-bell of the 'inner' p-type region. At the back of the C-shaped photosensitive area, the larger area 'outer' p-type region includes a contact area connected to the photosensitive area by a short bar that provides p-type electrical interconnection between the contact and photosensitive areas of this p-type region. The common n-side contact for the two photodiode may be provided in the same manner as in the rear light-entry version of FIGS. 2A and 2B, or alternatively it may be provided, as depicted in FIGS. 3A and 3B by a layer 38c of contact metal applied to the bottom face of the substrate 20.

Reverting attention to FIG. 1, photocurrent produced by the small area photodiode 14a flows through resistor 15 to produce a signal at one input of a differential amplifier 16. The larger area photodidde 14b is similarly connected to resistor 15, but by way of a gate 17. Thus photodiode 14b produces a photocurrent which adds to the signal input to differential amplifier when gate 17 is in its conducting state, but not when it is in its isolating state. The output of differential amplifier 16 provides an input to a digital controller 18. This digital controller provides two different outputs applied to digital-to-analogue converters 19a and 19b producing respectively a signal controlling the amplitude of current supplied by current generator 10, and a second input signal to the differential amplifier 16.

The monitor photodiode 14 differential amplifier 16 and digital controller 18 constitute a feedback control loop for regulating the optical power output of the laser 11. At the commencement of the marshalling procedure the controller 18 regulates the current supplied to the laser to provide an optical power output much smaller than will later be used for normal traffic transmission, typically about 40 dB smaller. At this sort of level, the photocurrent provided by the small area photodiode 14a is too small to enable the feedback control loop to function properly, and so gate 17 is rendered conductive so as to add in the contribution of photocurrent provided by the larger, and hence slower, photodiode 14b.

Marshalling involves incrementing, in a series of controlled amplitude steps, the output power supplied by the laser of an outstation until a power level is reached at which the basestation is able to recognise the transmission pattern and timing of the signals received by it from this outstation. This information is transmitted back to the outstation so that it can terminate the marshalling procedure and switch over to the transmission of data traffic at an appropriate power level and timing as determined by the results of the marshalling procedure.

Figure 4:
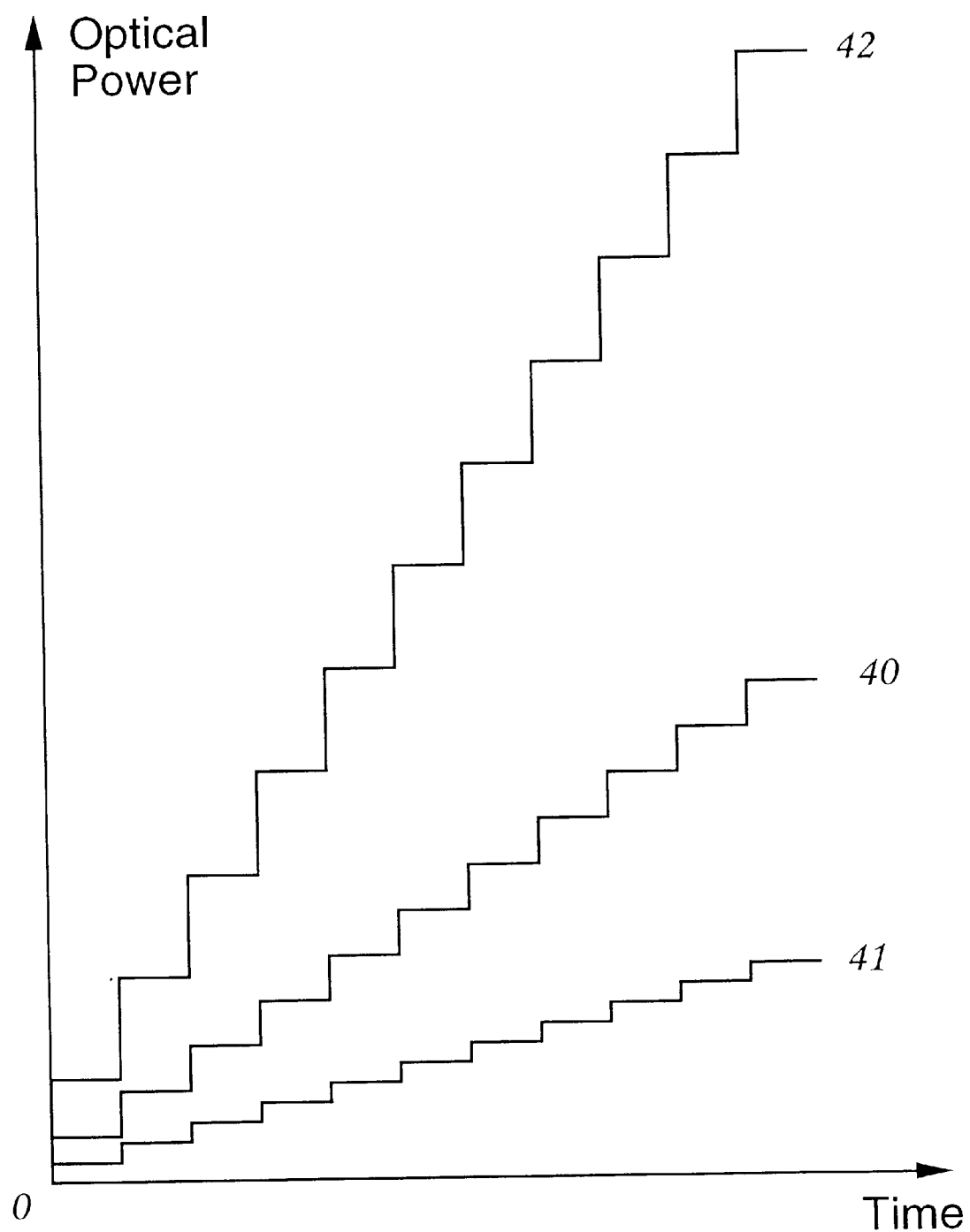
FIG. 4 is a graphical representation of the step increments in optical power level provided by the outstation during the marshalling procedure regulated by its controller.

The series of power increment steps is graphically represented at 40 in FIG. 4. In the absence of an operational feedback control loop to regulate the magnitude of the steps, there could be an over-estimate of the slope efficiency when incrementing the laser drive current, this giving rise to optical power step increments as represented at 41, or an under-estimate giving rise to optical power step increments as represented at 42. In the case of step increments 42, the magnitude of a single step may be so great as to be unsatisfactory because it takes the power level in one step from a level too low for appropriate action being taken by the basestation, to a level high enough to risk corruption of data traffic being transmitted to the basestation from one or more outstations. In the case of step increments 41, the magnitude single step may be so small as to be unsatisfactory because it takes too many steps, and hence takes too long a time from the commencement of the marshalling procedure, to reach a power level sufficient to engender appropriate action being taken by the basestation.

Once the marshalling procedure has been completed, the power level is sufficient for the feedback loop to be capable of operating satisfactorily without drawing any photocurrent from the larger photodetector 14b, and so under these circumstances gate 17 is maintained in its electrically isolating state. Under these conditions, with photocurrent being taken solely from the small area photodiode 14a, the response of the photodetector 14 is fast enough to resolve individual data bits of the data traffic transmitted by the laser diode 11.

What I claim is:

1. In an optical communications system, a marshalling method to control timing of communication signals between a plurality of outstations and a basestation, said method comprising transmitting a marshalling signal from an optical source at a first outstation to the basestation at a low signal strength and deriving a feedback control signal selectively from monitor first and second photosensor parts at said outstation to control said source during said communication signal transmission and during said marshalling procedure such as to provide separate feedback control of the level of the communication and marshalling signals.

2. In an optical communications system, a marshalling method to control timing of communication signals between a plurality of outstations and a basestation, which marshalling method is as claimed in claim 1, and wherein the marshalling signal is transmitted from the outstation to be received at the basestation at a signal strength too low to create significant corruption of data traffic received by the basestation from other outstations, which optical power output is the optical output of a current modulated injection laser chip whose current drive is regulated by a feedback control loop deriving a feedback control signal from the output of a monitor photosensor formed with a small area inner photosensitive part, constituting said first photosensor part, and embraced or encircled by a larger area slower response outer part, constituting said second photosensor part, in which method of regulation, the feedback control signal is derived solely from the inner part during said data traffic transmission, and is derived at least in part by the outer part during at least a part of said marshalling procedure.

\* \* \* \* \*